(12) United States Patent
Igarashi et al.

(10) Patent No.: US 6,384,483 B1
(45) Date of Patent: May 7, 2002

(54) MANUFACTURING METHOD FOR SEMICONDUCTOR DEVICE

(75) Inventors: Kinichi Igarashi; Hideaki Sato, both of Yamagata (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/472,431

(22) Filed: Dec. 27, 1999

Related U.S. Application Data

(62) Division of application No. 09/019,505, filed on Feb. 6, 1998, now Pat. No. 6,121,160.

(30) Foreign Application Priority Data

Feb. 6, 1997 (JP) ................................. 9-023592

(51) Int. Cl.$^7$ .................... H01L 23/48; H01L 23/52; H01L 29/40
(52) U.S. Cl. .................... 257/759; 257/637; 257/643
(58) Field of Search .................... 257/759, 758, 257/632, 637, 642, 643

(56) References Cited

U.S. PATENT DOCUMENTS

| 4,783,695 A | * | 11/1988 | Eichelberger et al. |
| 5,161,093 A | * | 11/1992 | Gorczyca et al. |
| 5,266,519 A | * | 11/1993 | Iwamoto |
| 5,699,234 A | * | 11/1993 | Saia et al. |
| 5,316,975 A | * | 5/1994 | Maeda |
| 6,121,160 A | * | 9/2000 | Igarachi et al. |

FOREIGN PATENT DOCUMENTS

| EP | 0 680 085 A1 | 4/1995 |
| JP | 1-150342 | 6/1989 |
| JP | 2-17640 | 1/1990 |
| JP | 3-125461 | 5/1991 |
| JP | 3-131028 | 6/1991 |
| JP | 4-94127 | 3/1992 |
| JP | 4-324958 | 11/1992 |
| JP | 8-316209 | 11/1996 |

* cited by examiner

Primary Examiner—Sheila V. Clark
(74) Attorney, Agent, or Firm—Young & Thompson

(57) ABSTRACT

A manufacturing method for a semiconductor device, wherein a polyimide-based resin layer is covered with a P-CVD oxide silicon film or the like before it is subjected to degassing process in order to prevent blisters or cracks of a cover film of a semiconductor device which has the polyimide-based resin layer as an interlayer insulating film. This makes it possible to take the semiconductor device out in open air after the degassing process and to prevent the dispersion of reaction products resulting from amidation during the degassing process.

9 Claims, 3 Drawing Sheets

MANUFACTURING METHOD FOR SEMICONDUCTOR DEVICE

CROSS-REFERENCE TO RELATED APPLICATIONS

This application is a division of application Ser. No. 09/019,505, filed Feb. 6, 1998 now U.S. Pat. No. 6,121,160.

BACKGROUND OF THE INVENTION

1. Field of the Invention

The present invention relates to a manufacturing method for a semiconductor device and, more particularly, to a manufacturing method for a semiconductor device which has multilayer interconnection.

2. Description of the Related Art

As an interlayer insulating film of a semiconductor device, a polyimide-based resin layer such as a polyimide layer or a polyimide layer to which silicon has been added (hereinafter referred to as "silicon polyimide layer") is used primarily because of the good flatness, low dielectric constant, and simple manufacturing process thereof. The polyimide-based layer, however, is disadvantageous in that moisture or chemicals used during the manufacturing process of semiconductor devices soak therein, requiring such moisture, etc. be diffused outside from the polyimide-based layer and degassing be carried out in an appropriate process. A failure to perform the degassing treatment results in the occurrence of blisters which lead to such damage as a cracked passivation and bulging wires due to the heat generated during the heat treatment after depositing a passivation film or the heat generated in operation.

A prior art for the foregoing process will be explained by reference to FIGS. 1A–1D. As shown in FIG. 1A, first-layer aluminum type wires 2-1 and 2-2 made of, for example, Al—Si—Cu alloy films are formed on a first insulating film 1 composed of a BPSG film or the like on a semiconductor substrate; an oxide silicon film or a silicon nitride film which is approximately 100 nm thick is deposited thereon by plasma chemical vapor deposition (CVD) to form a second insulating film 3; and a liquid material (e.g. LIXON coat, PIN-6001 made by Chisso K.K.) is applied thereto and subjected to heat curing to form, for example, a silicon polyimide layer 4. Next, as illustrated in FIG. 1B, a through hole 5 is formed and a second-layer aluminum type wire 6 is formed in the through hole 5 as illustrated in FIG. 1C. Then, as illustrated in FIG. 1D, a silicon nitride film 7 is deposited to a thickness of about 500 to about 1000 nm by the plasma CVD so as to produce the cover film. Subsequently, the cover film on a bonding pad, which is not shown, is removed. The semiconductor device completed after pelletizing and mounting has been presenting a problem in that it develops a blister 10 or cracks 11 as shown in FIG. 2. These troubles are considered due to the chemicals or moisture adhering to or taken into the silicon polyimide layer 4 when the through hole 5 or the second-layer aluminum type wire 6 is formed; hence, it is necessary to perform heat treatment at 400 to 450 degrees Celsius in, for example, a nitrogen atmosphere immediately before forming the silicon nitride film 7.

An example of such heat treatment has been disclosed in Japanese Unexamined Patent Publication No. 3-131028: it was found effective to form the silicon nitride film 7 without exposing it to open air after heating while pressure was being reduced, whereas, if the silicon nitride film 7 was formed after exposing it to open air following the heating, then no remarkable effect was observed although the troubles described above were decreased about 20% to about 30%.

According to the art disclosed in the foregoing Japanese Unexamined Patent Publication No. 3-131028, the cover film must be formed without exposure to open air during pressure reduction after heating. This presents a problem in that the efficiency for using CVD is low, leading to a disadvantage in process control. Further, in this art, the heating and degassing are performed with the polyimide layer exposed; therefore, reaction products or the like resulting from the progress of the amidation of the silicon polyimide layer adhere to a furnace core pipe or other pipes. This poses a problem in that the parts involved must be cleaned or replaced, frequently leading to lower productivity, or lower yield or deteriorated reliability due to the occurrence of refuse.

Japanese Unexamined Patent Publication No. 3-125461 has disclosed a technique in which heat treatment is performed in an atmosphere where $O_3$ is added to $N_2$ to promote the reaction of an undecomposed gas in a SOG film. This technique could be applied to the degassing process of the polyimide-based resin layer; however, no satisfactory effect can be expected because the exposure to atmospheric air after degassing undesirably allows the moisture contained in the atmospheric air to get into the polyimide-based resin layer again.

SUMMARY OF THE INVENTION

Accordingly, it is an object of the present invention to provide a manufacturing method for a semiconductor, which method permits further improvement in the trouble in process control, operation efficiency, and the occurrence of refuse.

To this end, according to the present invention, there is provided a manufacturing method for a semiconductor device, which method has a step for forming a polyimide-based resin layer as an interlayer insulating film, the method including a step wherein the polyimide-based resin layer is coated with an insulating film which lets moisture permeate therethrough whereas it suppresses the permeation of reaction products resulting from amidation when the layer is heated to a predetermined temperature, before it is subjected to heat treatment to degas it.

In this case, an oxide silicon film is formed as the insulating film by CVD, and the heat treatment may be carried out in non-oxidizing atmosphere. Alternatively, the oxide silicon film is formed by plasma CVD, and the heat treatment may be carried out in a nitrogen atmosphere.

The polyimide-based resin film may be a silicon polyimide film; and the thickness of the oxide silicon film may range from 80 nm to 500 nm; and the temperature of the heat treatment may range from 300 to 400 degrees Celsius.

When heat treatment is performed for degassing with the layer coated with an insulating film such as an oxide silicon film formed using CVD, especially plasma CVD, mainly moisture is released and less reaction products resulting from the progress of amidation reaction are dispersed; and the layer hardly absorbs moisture even when it is exposed to atmospheric air at a temperature around room air temperature.

DETAILED DESCRIPTION OF THE PREFERRED EMBODIMENTS

Referring now to the accompanying drawings, the invention will be explained.

Figure 1A:
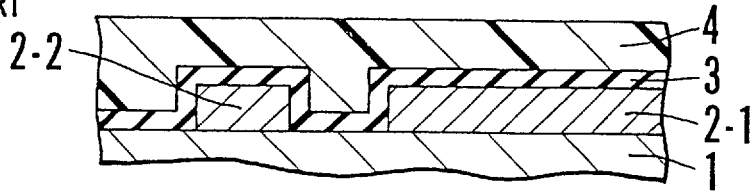
FIG. 1A through FIG. 1D are cross-sectional views illustrating the conventional steps arranged in sequence for forming an interlayer insulating film of a semiconductor device.
Figure 1B:
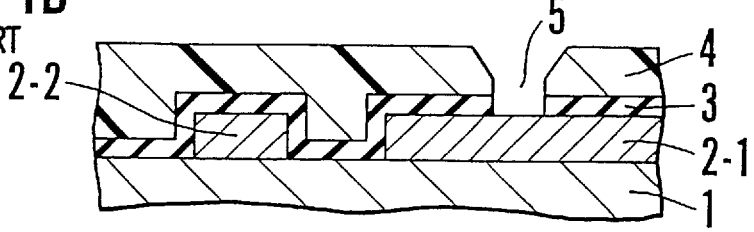
Figure 1C:
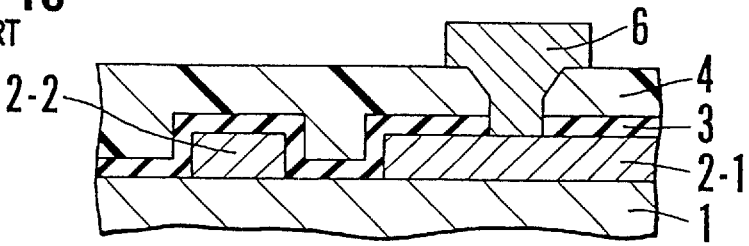
Figure 1D:
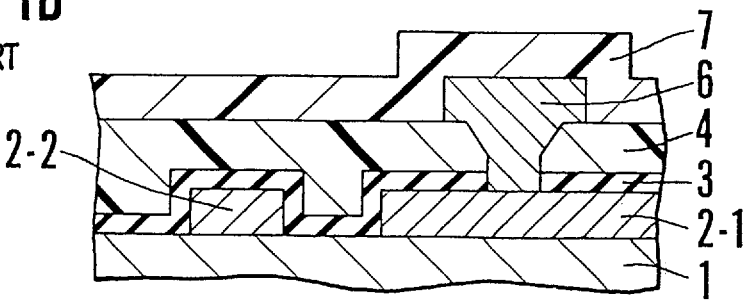
Figure 2:
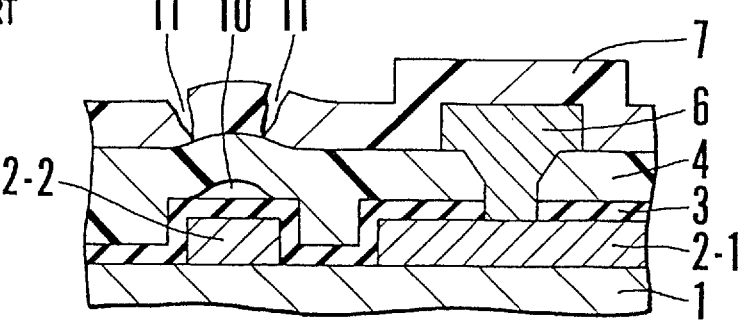
FIG. 2 illustrates the problems with the interlayer insulating film which has been formed using the conventional method.
Figure 3A:
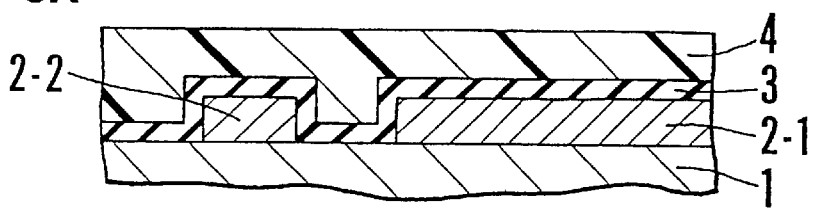
FIG. 3A through FIG. 3E are cross-sectional views illustrating the steps of a first embodiment according to the invention which are arranged in sequence for forming an interlayer insulating film of a semiconductor device.

First, a first embodiment in accordance with the invention will be explained with reference to FIGS. 3A through 3E. As shown in FIG. 3A, first-layer aluminum type wires 2-1, 2-2, and so on are formed on an insulating film 1. The insulating film 1 indicates an interlayer insulating film formed on the entire surface of, for example, a P type silicon semiconductor substrate, which is not shown, where an active region has been defined in a device separation region such as a field insulating film or the like, and a device such as a MOS transistor has been formed. The first-layer aluminum type wires 2-1, 2-2, and so on are produced by making a necessary through hole (not shown) in the insulating film 1, depositing an Al—Si—Cu alloy film or the like thereon, and patterning. Then, a 150 nm-thick oxide silicon film 3 is deposited using CVD or the like. In the next step, LIXON coat (grade: PIN-6001) made by Chisso K.K., for example, is applied and dried before performing heat treatment, i.e. curing, at 400 degrees Celsius for 60 minutes, thereby forming a silicon polyimide layer 4 as the interlayer insulating film.

Figure 3B:
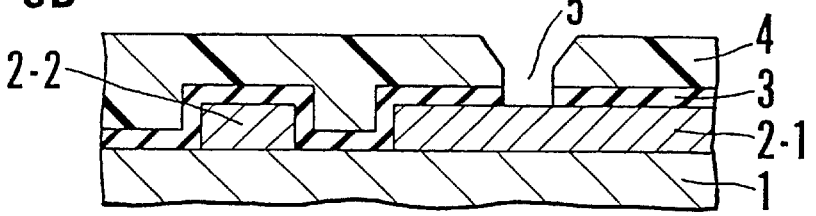
Figure 3C:
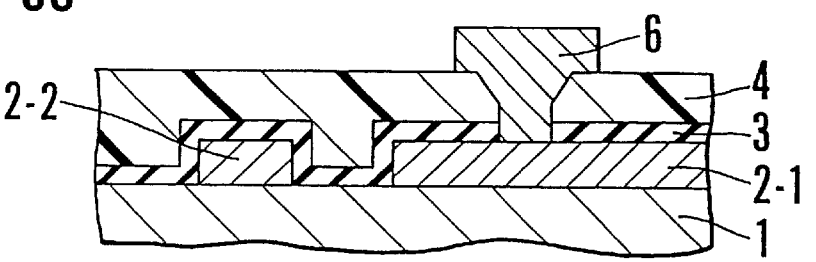

Subsequently, a through hole 5 is formed on the first-layer aluminum type wire 2-1 as shown in FIG. 3B. Then, an Al—Si—Cu alloy film is deposited, and patterning is performed thereon to form a second-layer aluminum type wire 6 as illustrated in FIG. 3C.

Figure 3D:
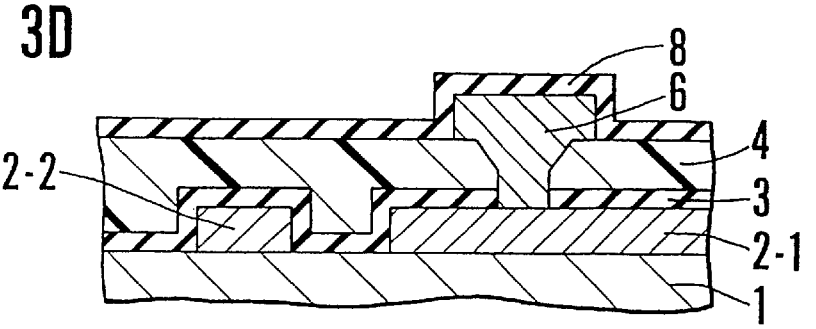

In the following step, an oxide silicon film 8 (hereinafter referred to as "P-CVD oxide silicon film") having a thickness of 80 to 500 nm, preferably 120 nm, is formed as shown in FIG. 3D by CVD, especially plasma CVD, using a reactant gas $SiH_4$—$N_2O$ ($N_2$ may be used as the carrier gas) at a temperature of 350 degrees Celsius and under a pressure of 47 Pa.

If the thickness of the P-CVD oxide silicon film 8 is below 80 nm, the P-CVD oxide silicon film 8 develops cracks, while if the thickness exceeds 500 nm, it becomes difficult for the moisture to diffuse outside from the silicon polyimide layer 4 during the following heat treatment. In this embodiment, the thickness of the P-CVD oxide silicon film has been set to 120 nm which is sufficiently away from the upper and lower limits, namely, 80 nm and 500 nm, respectively.

In the following step, heat treatment (degassing) was carried out in a 1-atm $N_2$ atmosphere at 300 to 400 degrees Celsius for 30 minutes to 1 hour, e.g. at 400 degrees Celsius for 30 minutes.

Figure 3E:
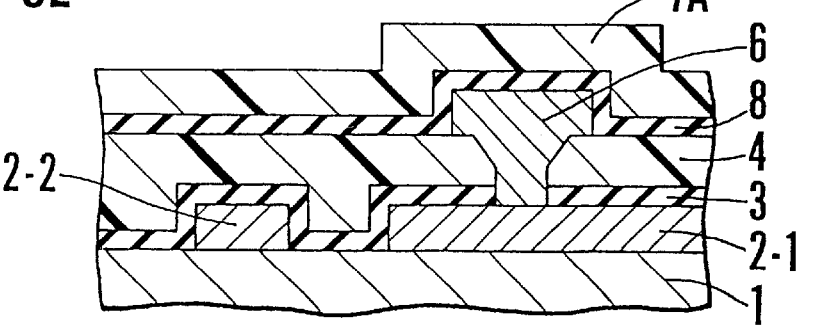

Next, a silicon nitride film is deposited to a thickness of about 180 to about 500 nm by the plasma CVD so as to form a cover film 7A as shown in FIG. 3E.

One hundred samples of the semiconductor devices fabricated as described above have been subjected to heat treatment at 400 degrees Celsius for 30 minutes; no cracks or blisters have been observed.

The contamination of the heat treatment apparatus (the CVD apparatus in the case of Japanese Unexamined Patent Publication 3-131028) caused by the degassing process mentioned above has been markedly reduced as compared with the case where the degassing process is implemented without providing the P-CVD oxide silicon film 8. Thus, the frequency of cleaning or replacing the furnace core pipes or other pipes has been decreased to approximately one tenth.

The silicon polyimide layer 4 shown in FIG. 3A has not yet completed amidation, so that the amidation reaction proceeds during the degassing process. It is likely that contamination caused by the then reaction product which is diffused in the P-CVD oxide silicon film and released to contaminate its surroundings will be satisfactorily suppressed. This means that the embodiment is likely to provide the effect for controlling the diffusion of reaction products.

It is considered that the chemicals or moisture, especially the moisture, used when forming the through hole 5 or the second-layer aluminum type wire 6 is taken into the silicon polyimide layer 4. It is considered that the occurrence of blisters or cracks is prevented since the moisture is diffused in the P-CVD oxide silicon film and released outside during the degassing process as described above.

There is a possibility that the reaction products or chemicals resulting from the amidation reaction are not released outside because of the presence of the P-CVD oxide silicon film 8, and therefore, a danger of adverse influences on the semiconductor device is conceivable. However, there should be no problem because no abnormality has been observed when some tests were conducted, which tests included a pressure cooker test (PCT) conducted for 300 hours, and a high-temperature and -humidity bias test (HHBT) conducted at 85 degrees Celsius, 85% relative humidity, and VDD=7V for 500 hours.

A second embodiment of the invention will now be explained.

Figure 4A:
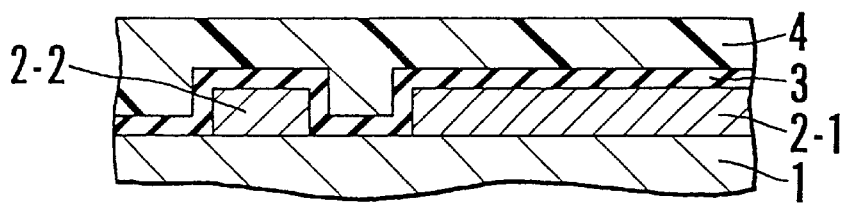
FIG. 4A through FIG. 4E are cross-sectional views illustrating the steps of a second embodiment according to the invention which are arranged in sequence for forming an interlayer insulating film of a semiconductor device.

In exactly the same manner as in the first embodiment, first-layer aluminum type wires 2-1, 2-2, and so on are formed on an insulating film 1, and an oxide silicon film 3 is deposited thereon by CVD or the like, then a silicon polyimide layer 4 is formed as shown in FIG. 4A.

Figure 4B:
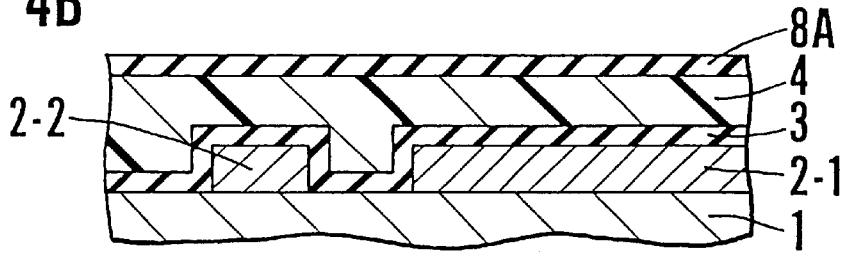

In the next step, as in the case of the first embodiment, a P-CVD oxide silicon film 8A having a thickness of 80 to 500 nm is deposited on the entire surface of the silicon polyimide layer as shown in FIG. 4B, then it is subjected to the degassing process in a 1-atm $N_2$ atmosphere at 300 to 400 degrees Celsius for 30 minutes to 1 hour, e.g. at 400 degrees Celsius for 30 minutes.

Figure 4C:
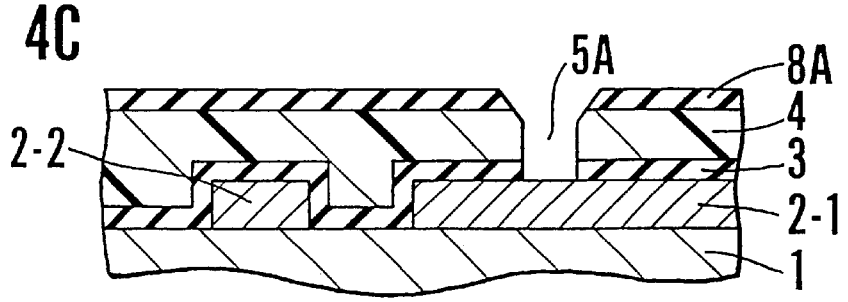
Figure 4D:
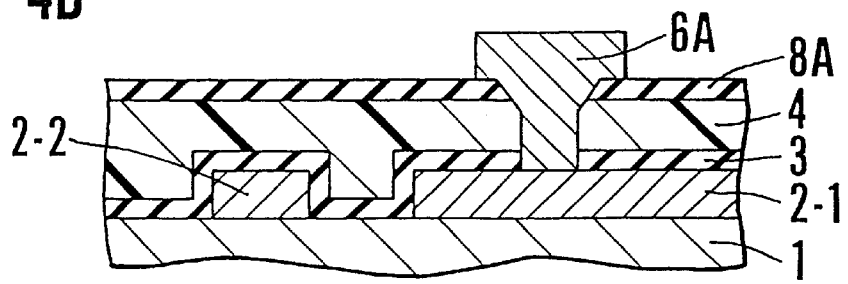
Figure 4E:
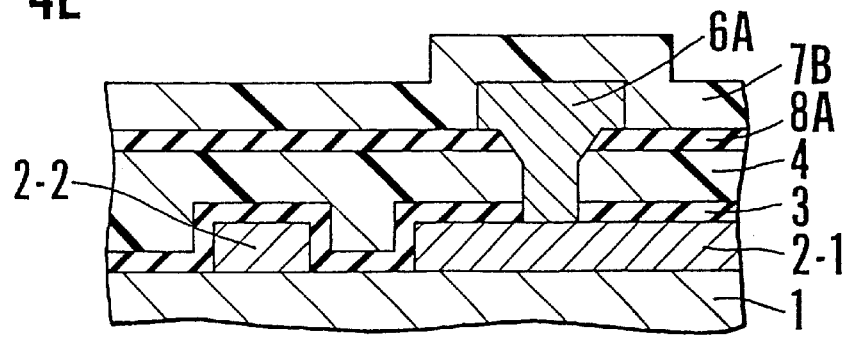

Subsequently, a through hole 5A is formed on the first-layer aluminum type wire 2-1 as shown in FIG. 4C, an Al—Si—Cu alloy film or the like is deposited thereon, then patterning is performed to form a second-layer aluminum type wire 6A as illustrated in FIG. 4D. Lastly, a silicon nitride film is deposited to a thickness of about 180 nm to about 500 nm by the plasma CVD to form a cover film 7B as shown in FIG. 4E.

The second embodiment is characterized in that the deposition and degassing of the P-CVD oxide silicon film 8A is carried out after curing the silicon polyimide layer 4 following the formation of the first-layer aluminum type wire 2-1.

In general, during the lithography process for forming the through holes and the lithography process for forming the aluminum type wires, moisture soaks into the silicon polyimide layer in the wetting step. The chances of the moisture being soaked into the silicon polyimide layer through other portions than the through holes can be reduced by advancing the step for forming the P-CVD oxide silicon film earlier than in the first embodiment. This provides an advantage in that the danger of the occurrence of blisters or cracks can be further reduced.

The temperature for the degassing process in the first and second embodiments is set at 300 to 400 degrees Celsius because inadequate release of moisture will result if the temperature is below 300 degrees Celsius, while the decomposition of the polyimide used is accelerated if the temperature exceeds 400 degrees Celsius. Accordingly, the degassing may be conducted at a higher temperature, depending on the type of polyimide; however, the upper limit should be approximately 450 degrees Celsius because at temperatures higher than that will cause hillocks on the aluminum type wires.

The degassing process has been implemented in the 1-atm N2 atmosphere; however, it may alternatively be carried out in a plasma CVD apparatus for forming the P-CVD oxide silicon films or in an external heat treatment furnace, or in the same apparatus for forming the cover films. This is because once the silicon polyimide layer has been coated with the P-CVD oxide silicon film, the silicon polyimide layer does not absorb moisture even if it is exposed to open air at a temperature around room air temperature, and it is hardly likely that the surroundings will be contaminated by reaction products.

Further, a polyimide layer may be formed in place of the silicon polyimide layer, or an oxide silicon film deposited using CVD may be formed in place of the P-CVD oxide silicon film, or other insulating film may be formed as long as the film is stable at room air temperature and has an appropriate thickness which lets moisture permeate to a certain extent whereas it hardly lets the reaction products from amidation permeate in a temperature range of 300 to 450 degrees Celsius. The oxide silicon film, acid silicon nitride film, and the silicon nitride film formed by the plasma CVD are somewhat porous, so that the foregoing conditions are likely to be satisfied depending on the thickness thereof.

Thus, according to the invention, the polyimide-based resin layer is formed as the interlayer insulating film, then it is coated with the insulating film which permeates moisture while it suppresses the permeation of the reaction products resulting from amidation when heated at a predetermined temperature before it is subjected to heat treatment (degassing) This allows the assembly to be taken out in open air at a temperature around room air temperature after degassing, thus providing an advantage of easier process control. Moreover, the dispersion of the foregoing reaction products is suppressed, so that the occurrence of harmful refuse can be controlled, enabling improved yield and reliability, and remarkably reduced danger of contaminating a manufacturing apparatus, leading to a lower frequency of cleaning or replacement of parts. This results in an advantage of easier maintenance and higher productivity.

What is claimed is:

1. A semiconductor device comprising:
   a first oxide silicon film with a bottom surface directly on a conductive layer;
   a polyimide-based resin layer with a first surface directly on a top surface of said first oxide silicon film that is opposite said bottom surface; and
   a second oxide silicon film directly on a second surface of said polyimide-based resin layer that is opposite said first surface, said second oxide silicon film having a thickness of 80–500 nm, wherein said second oxide silicon film allows moisture to permeate therethrough suppressing the permeation of reaction products.

2. The semiconductor device of claim 1, wherein said polyimide-based resin layer is a silicon polyimide film.

3. A semiconductor device comprising:
   a polyimide-based resin layer with a first surface opposite a second surface;
   two silicon oxide films that sandwich said polyimide-based resin layer and that each directly contact a respective one of said first and second surfaces,
   a first one of said two oxide silicon films having a thickness of 80–500 nm and allows moisture to permeate therethrough suppressing the permeation of reaction products.

4. The semiconductor device of claim 3, wherein a second one of said two oxide silicon films directly contacts a conductive layer.

5. The semiconductor device of claim 3, wherein said polyimide-based resin layer is a silicon polyimide film.

6. A semiconductor device comprising:
   a conductive layer on an insulating layer;
   a first oxide silicon film with a bottom surface directly on said conductive layer;
   polyimide-based layer with a first surface directly on a top surface of said first oxide silicon film that is opposite said bottom surface;
   a second oxide silicon film directly on a second surface of said polyimide-based resin layer that is opposite said first surface, said second oxide silicon film having a thickness of 80–500 nm, wherein said second silicon oxide film allows moisture to permeate therethrough suppressing the permeation of reaction products;
   a contact plug that extends through said polyimide-based resin layer and said first oxide silicon film and that contacts said conductive layer; and
   a cover film over said second oxide silicon film and said contact plug.

7. The semiconductor device of claim 6, wherein a portion of said second oxide silicon film is between said cover film and said contact plug.

8. The semiconductor device of claim 6, wherein said cover film directly contacts said contact plug.

9. The semiconductor device of claim 6, wherein said polyimide-based resin layer is a silicon polyimide film.

* * * * *